United States Patent
Tao et al.

(10) Patent No.: US 11,380,129 B2
(45) Date of Patent: Jul. 5, 2022

(54) TEXTURE RECOGNITION DEVICE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Jingfu Tao, Beijing (CN); Pengfei Cheng, Beijing (CN); Lu Yu, Beijing (CN); Kangle Chang, Beijing (CN); Heling Zhu, Beijing (CN); Jian Sang, Beijing (CN); Chuandong Liao, Beijing (CN); Yinwei Chen, Beijing (CN); Jingang Liu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 16/963,984

(22) PCT Filed: Sep. 4, 2019

(86) PCT No.: PCT/CN2019/104349
§ 371 (c)(1),
(2) Date: Jul. 22, 2020

(87) PCT Pub. No.: WO2021/042283
PCT Pub. Date: Mar. 11, 2021

(65) Prior Publication Data
US 2021/0406496 A1    Dec. 30, 2021

(51) Int. Cl.
*G06V 40/13*    (2022.01)
*G06V 40/12*    (2022.01)

(52) U.S. Cl.
CPC ...... *G06V 40/1376* (2022.01); *G06V 40/1318* (2022.01)

(58) Field of Classification Search
CPC ... G06K 9/001; G06K 9/0004; G06K 9/00046
See application file for complete search history.

(56) References Cited

U.S. PATENT DOCUMENTS

| | | | |
|---|---|---|---|
| 2012/0321149 A1* | 12/2012 | Carver | G06K 9/0012 382/124 |
| 2017/0017824 A1 | 1/2017 | Smith et al. | |

(Continued)

FOREIGN PATENT DOCUMENTS

| | | |
|---|---|---|
| CN | 105550664 A | 5/2016 |
| CN | 106355160 A | 1/2017 |

(Continued)

OTHER PUBLICATIONS

International Search Report of PCT/CN2019/104349 in Chinese, dated May 27, 2020.

(Continued)

*Primary Examiner* — Lixi C Simpson
(74) *Attorney, Agent, or Firm* — Collard & Roe, P.C.

(57) ABSTRACT

A texture recognition device and a display device are provided. The texture recognition device includes a backlight element, configured to provide first backlight; a light constraint element, configured to perform a light divergence angle constraint process on the first backlight to obtain second backlight with a divergence angle within a preset angle range, the second backlight being transmitted to a detection object; and a photosensitive element, configured to detect the second backlight reflected by a texture of the detection object to recognize a texture image of the texture of the detection object.

18 Claims, 5 Drawing Sheets

(56) References Cited

U.S. PATENT DOCUMENTS

| | | | | |
|---|---|---|---|---|
| 2018/0258401 A1* | 9/2018 | Karanu | | A61K 35/39 |
| 2019/0034686 A1* | 1/2019 | Ling | | G06K 9/00053 |
| 2019/0080141 A1 | 3/2019 | Tan | | |
| 2019/0094593 A1 | 3/2019 | Hasegawa et al. | | |
| 2019/0347462 A1* | 11/2019 | Tseng | | G02B 5/003 |
| 2020/0026898 A1* | 1/2020 | Fan | | H04N 5/2253 |
| 2020/0348550 A1* | 11/2020 | Wu | | G06K 9/0004 |
| 2021/0035959 A1* | 2/2021 | Yang | | H01L 33/507 |
| 2021/0174053 A1* | 6/2021 | Nam | | G06K 9/0008 |

FOREIGN PATENT DOCUMENTS

| | | |
|---|---|---|
| CN | 107609456 A | 1/2018 |
| CN | 109633959 A | 4/2019 |
| CN | 109683375 A | 4/2019 |

OTHER PUBLICATIONS

Notice of Transmittal of the International Search Report of PCT/CN2019/104349 in Chinese, dated May 27, 2020.
Written Opinion of the International Searching Authority of PCT/CN2019/104349 in Chinese, dated May 27, 2020.

* cited by examiner

µm to 65 µm, which comprises: in a case where the shape of each of the plurality of hollowed-out regions is a square, a side length of the square ranges from 25 µm to 65 µm; in a case where the shape of each of the plurality of hollowed-out regions is a rectangle, a long side of the rectangle ranges from 25 µm to 65 µm, a short side of the rectangle ranges from 25 µm to 65 µm, and a length of the long side is greater than a length of the short side; in a case where the shape of each of the plurality of hollowed-out regions is a regular triangle, a side length of the regular triangle ranges from 25 µm to 65 µm; in a case where the shape of each of the plurality of hollowed-out regions is a regular hexagon, a distance between two parallel sides of the regular hexagon ranges from 25 µm to 65 µm; and in a case where the shape of each of the plurality of hollowed-out regions is a circle, a diameter of the circle ranges from 25 µm to 65 µm.

TEXTURE RECOGNITION DEVICE AND DISPLAY DEVICE

CROSS REFERENCE TO RELATED APPLICATIONS

This application is the National Stage of PCT/CN2019/104349 filed on Sep. 4, 2019, the disclosure of which is incorporated by reference.

TECHNICAL FIELD

Embodiments of the present disclosure relate to a texture recognition device and a display device.

BACKGROUND

Fingerprint is a texture formed by concave and convex skin at an end of human finger, in which a convex position is called ridge and a concave position is called valley. Because everyone's fingerprints are different, fingerprint identification technologies have been widely used for identifying personal identification. Similarly, people have developed palm print recognition technology.

Among many fingerprint acquisition technologies, the emergence and popularization of an optical fingerprint acquisition technology promotes the rapid collection and verification of fingerprints on site. However, in the process of optical fingerprint acquisition, if the incident angle of the light incident on the finger is too large, the large-angle incident light is reflected by the finger and will cause crosstalk to the fingerprint recognition, resulting in the inability to accurately identify the valleys and ridges of the fingerprint.

SUMMARY

At least one embodiment of the present disclosure provides a texture recognition device, the texture recognition device comprises: a light constraint element, configured to perform a light divergence angle constraint process on the first backlight to obtain second backlight with a divergence angle within a preset angle range, the second backlight being transmitted to a detection object; and a photosensitive element, configured to detect the second backlight reflected by a texture of the detection object to recognize a texture image of the texture of the detection object.

For example, in the texture recognition device provided by some embodiments of the present disclosure, the light constraint element comprises a collimating film, the collimating film has a mesh structure and comprises a plurality of hollowed-out regions, and each of the plurality of hollowed-out regions is configured to transmit part first backlight, whose divergence angle is within the preset angle range, of the first backlight to obtain the second backlight.

For example, in the texture recognition device provided by some embodiments of the present disclosure, the plurality of hollowed-out regions are arranged in an array, and a shape of each of the plurality of hollowed-out regions comprises a square, a rectangle, a regular triangle, a regular hexagon, or a circle.

For example, in the texture recognition device provided by some embodiments of the present disclosure, a thickness of the collimating film ranges from 400 µm to 800 µm.

For example, in the texture recognition device provided by some embodiments of the present disclosure, a size of each of the plurality of hollowed-out regions ranges from 25

For example, in the texture recognition device provided by some embodiments of the present disclosure, the backlight element comprises a direct-lit backlight light source, the direct-lit backlight light source comprises a plurality of light-emitting diodes arranged in an array, and the plurality of light-emitting diodes are configured to provide initial backlight, and the first backlight comprises the initial backlight.

For example, in the texture recognition device provided by some embodiments of the present disclosure, the plurality of light-emitting diodes are in one-to-one correspondence to the plurality of hollowed-out regions, and each of the plurality of light-emitting diodes at least partially overlaps with a corresponding hollowed-out region in a direction perpendicular to the collimating film.

For example, in the texture recognition device provided by some embodiments of the present disclosure, the plurality of light-emitting diodes comprise a plurality of sub-millimeter light-emitting diodes or a plurality of micro light-emitting diodes.

For example, in the texture recognition device provided by some embodiments of the present disclosure, the backlight element comprises an edge-lit backlight light source and a light guide plate, and the light guide plate is arranged on a light exit side of the edge-lit backlight light source, the edge-lit backlight light source is configured to provide light source backlight, and the light source backlight is transmitted through the light guide plate to obtain initial backlight, and the first backlight comprises the initial backlight.

For example, in the texture recognition device provided by some embodiments of the present disclosure, the backlight element comprises a first backlight module, the first backlight module comprises a direct-lit backlight light source, a diffusion sheet, a first prism sheet, and a second prism sheet, the diffusion sheet is on a side of the direct-lit backlight light source close to the light constraint element, the first prism sheet is on a side of the diffusion sheet close to the light constraint element, the second prism sheet is on a side of the first prism sheet close to the light constraint element, the direct-lit backlight light source is configured to provide initial backlight, the initial backlight sequentially passes through the diffusion sheet, the first prism sheet, and the second prism sheet to obtain intermediate backlight, and the first backlight comprises the intermediate backlight.

For example, in the texture recognition device provided by some embodiments of the present disclosure, the backlight element comprises a second backlight module, the second backlight module comprises an edge-lit backlight light source, a light guide plate, a diffusion sheet, a first prism sheet, and a second prism sheet, the light guide plate is on a light exit side of the edge-lit backlight light source, the diffusion sheet is on a side of the light guide plate close to the light constraint element, the first prism sheet is on a side of the diffusion sheet close to the light constraint element, and the second prism sheet is on a side of the first prism sheet close to the light constraint element, the edge-lit backlight light source is configured to provide light source backlight, the light source backlight sequentially passes through the light guide plate, the diffusion sheet, the first prism sheet, and the second prism sheet to obtain intermediate backlight, and the first backlight comprises the intermediate backlight.

For example, in the texture recognition device provided by some embodiments of the present disclosure, the backlight element comprises an edge-lit backlight light source and a light guide plate, the light guide plate is on a light exit side of the edge-lit backlight light source, the light constraint element comprises an inverse prism sheet, the inverse prism sheet is on a light exit side of the light guide plate, the edge-lit backlight light source is configured to provide light source backlight, and the light source backlight is transmitted through the light guide plate to obtain initial backlight, and the first backlight comprises the initial backlight; and the inverse prism sheet is configured to cause the first backlight to be refracted to obtain the second backlight.

For example, in the texture recognition device provided by some embodiments of the present disclosure, the light guide plate comprises a first light incident surface, a first light reflecting surface, and a first light exit surface, and the first light reflecting surface and the first light exit surface are oppositely arranged in a first direction, the first light incident surface is configured to receive the light source backlight, the first light reflecting surface is configured to reflect the light source backlight, and the initial backlight emits from the first light exit surface, the first light reflecting surface comprises a prism pillar structure array, the prism pillar structure array comprises a plurality of triangular prism pillars arranged in sequence along a second direction, the second direction is perpendicular to the first direction, a thickness of each of the plurality of triangular prism pillars is less than 2.5 μm in the first direction, a distance between two adjacent triangular prism pillars ranges from 45 μm to 50 μm in the second direction, the inverse prism sheet comprises a second light incident surface and a second light exit surface, the second light incident surface and the second light exit surface are oppositely arranged in the first direction, the second light incident surface is configured to receive the first backlight, the second backlight emits from the second light exit surface, the second light incident surface comprises a prism structure array, the prism structure array comprises a plurality of inverse prisms arranged in sequence along the second direction, in the first direction, a thickness of each of the plurality of inverse prisms ranges from 10 μm to 25 μm, and in the second direction, a distance between two adjacent inverse prisms ranges from 20 μm to 50 μm.

For example, in the texture recognition device provided by some embodiments of the present disclosure, the backlight element further comprises a reflecting sheet, the reflecting sheet is on a side of the backlight element away from the light constraint element, and is configured to reflect light incident on the reflecting sheet to obtain reflected light, and the first backlight further includes the reflected light.

For example, in the texture recognition device provided by some embodiments of the present disclosure, the photosensitive element comprises a plurality of photosensitive sensors arranged in an array.

For example, in the texture recognition device provided by some embodiments of the present disclosure, the plurality of photosensitive sensors are in one-to-one correspondence to the plurality of hollowed-out regions.

For example, in the texture recognition device provided by some embodiments of the present disclosure, each of the plurality of photosensitive sensors comprises a light transmitting region and a photoelectric conversion region.

For example, in the texture recognition device provided by some embodiments of the present disclosure, the light transmitting region at least partially surrounds the photoelectric conversion region.

For example, in the texture recognition device provided by some embodiments of the present disclosure, the preset angle range is 0 degree to 20 degrees.

For example, in the texture recognition device provided by some embodiments of the present disclosure, the texture of the detection object comprises a skin corresponding to a fingerprint of a user, and the texture image comprises a fingerprint image.

At least one embodiment of the present disclosure also provides a display device, which comprises any one of the texture recognition devices provided by the above embodiments.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

DETAILED DESCRIPTION

Figure 1A:
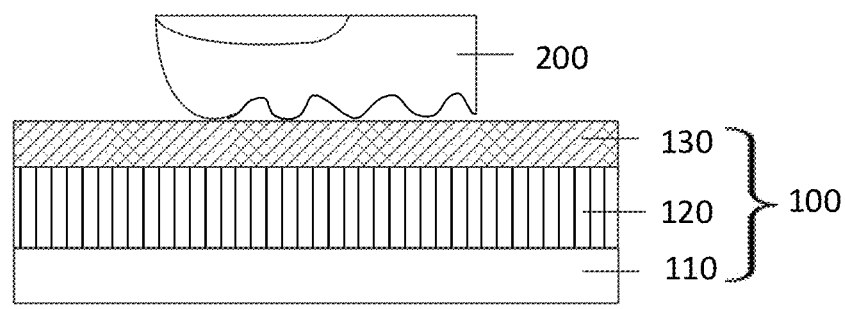
FIG. 1A is a schematic block diagram of a texture recognition device provided by embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

Embodiments of the present disclosure provide a texture recognition device, which includes a backlight element, a light constraint element, and a photosensitive element. The backlight element is configured to provide first backlight; the light constraint element is configured to perform a light divergence angle constraint process on the first backlight to obtain second backlight with a divergence angle within a preset angle range; the photosensitive element is configured to detect the second backlight reflected by a texture of a detection object to recognize a texture image of the texture of the detection object.

In the present disclosure, the detection object can be a user, and the texture of the detection object can be fingerprints, palm prints, etc. The following description takes the fingerprint of the user as an example, but obviously the present disclosure is not limited to this case.

Texture recognition device provided by the embodiments of the present disclosure can use the light constraint element to restrict the divergence angle of backlight used for texture recognition, so that the problem of light crosstalk in the process of texture recognition can be prevented or reduced, and the accuracy of texture recognition can be improved.

Hereinafter, embodiments of the present disclosure will be described in detail with reference to the accompanying drawings. It should be noted that the same or similar reference numerals in different drawings will be used to refer to the same elements that have been described.

FIG. 1A is a schematic block diagram of a texture recognition device provided by an embodiment of the present disclosure. As shown in FIG. 1A, the texture recognition device 100 includes a backlight element 110, a light constraint element 120, and a photosensitive element 130.

The backlight element 110 is configured to generate first backlight. For example, the first backlight can be used for texture recognition, such as fingerprint recognition, after the light constraint element 120 performs the light divergence angle constraint process on the first backlight.

As shown in FIG. 1A, the light constraint element 120 is located on a side of the backlight element 110 close to the photosensitive element 130, and is configured to perform the light divergence angle constraint process on the first backlight generated by the backlight element 110 to obtain second backlight with a divergence angle within a preset angle range.

As shown in FIG. 1A, the photosensitive element 130 is located on a side of the light constraint element 120 away from the backlight element 110, that is, the light constraint element 120 is located between the photosensitive element 130 and the backlight element 110. The second backlight may be incident on the user's skin 200 and reflected by the user's skin 200, and the photosensitive element 130 is configured to detect the second backlight reflected by the user's skin 200 to acquire texture information of the user's skin 200, thereby identifying the texture image of the user's skin 200.

For example, the user's skin may include a skin corresponding to users fingerprints, the texture information of the user's skin may be information corresponding to the fingerprints, and the texture image includes the fingerprint image. For example, the users fingerprints may include fingerprints, such as finger fingerprints, toe fingerprints, and the like.

For example, the preset angle range may be an angle range of an included angle between a light ray (e.g., the second backlight) incident on the user's skin and a normal direction, and the normal direction may be a direction perpendicular to a plane where the photosensitive element 130 is located. For example, the preset angle range can be 0~20 degrees, for example, 0~15 degrees. It should be noted that the specific value of the preset angle range can be preset according to the actual situation.

Figure 1B:
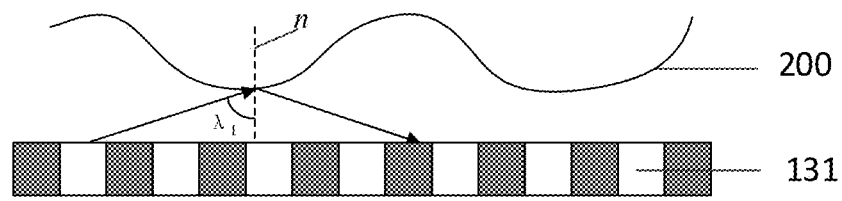
FIG. 1B is a schematic diagram showing light, whose divergence angle is outside a preset angle range, incident on a user's skin.
Figure 1C:
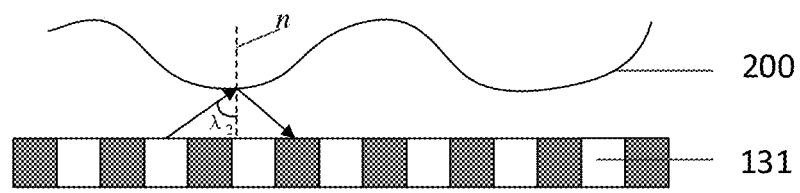
FIG. 1C is a schematic diagram showing second backlight incident on a user's skin provided by embodiments of the present disclosure.

FIG. 1B is a schematic diagram showing light, whose divergence angle is outside a preset angle range, incident on the user's skin; and FIG. 1C is a schematic diagram showing second backlight incident on the user's skin provided by an embodiment of the present disclosure.

For example, as shown in FIGS. 1B and 1C, the photosensitive element 130 may include a plurality of photosensitive sensors, the plurality of photosensitive sensors constitute a photosensitive sensor array 131. Each photosensitive sensor can be an appropriate type of image sensor, for example, a glass substrate image sensor, for example, the manufacture method of the photosensitive sensor can include manufacturing a photosensitive pixel array on a glass substrate and then cutting the photosensitive pixel array to obtain the photosensitive sensor. In the case where the user's skin 200 corresponds to the user's fingerprint, the valley ridge period of the fingerprint is about 350 microns (μm), that is, the sum of the length of one valley and the length of one ridge is about 350 μm.

As shown in FIG. 1B, for a ridge of the fingerprint, in the case where light whose divergence angle is outside the preset angle range (for example, an angle of an included angle $\lambda_1$ between the light and the normal n is greater than 20 degrees, for example, $\lambda_1$ is 40 degrees, 50 degrees, etc.) is incident on the surface of the ridge, the light reflected by the ridge can be incident on the photosensitive sensor corresponding to a valley adjacent to the ridge, for example, or incident on the photosensitive sensor corresponding to a ridge adjacent to the ridge, thereby causing light crosstalk and reducing contrast and recognition accuracy.

It should be noted that "valley adjacent to the ridge" means that the ridge is directly adjacent to the valley, that is, there is no ridge or valley between them; and "ridge adjacent to the ridge" means that there is no ridge between the two ridges, but there is a valley between the two ridges.

As shown in FIG. 1C, in the case where the user's skin 200 corresponds to the users fingerprint, for a ridge of the fingerprint, in the case where the second backlight (for example, an angle of an included angle $\lambda_2$ between the second backlight and the normal n is 15 degrees), which is emitted from the light constraint element 120 and has a divergence angle within the preset angle range, is incident on the surface of the ridge, and the second backlight reflected by the ridge can be incident on the photosensitive sensor corresponding to the ridge; for a valley of the fingerprint, in the case where the second backlight, which is emitted from the light constraint element 120 and has a divergence angle within the preset angle range, is incident on the surface of the valley, the second backlight reflected by the valley can be incident on the photosensitive sensor corresponding to the valley, thereby preventing light crosstalk and improving the contrast of texture recognition.

It should be noted that "photosensitive sensor corresponding to the ridge" means a plurality of photosensitive sensors covered by an orthographic projection of the ridge on the photosensitive element 130; "photosensitive sensor corresponding to the valley" means the photosensitive sensor covered by an orthographic projection of the valley on the photosensitive element 130.

Figure 2A:
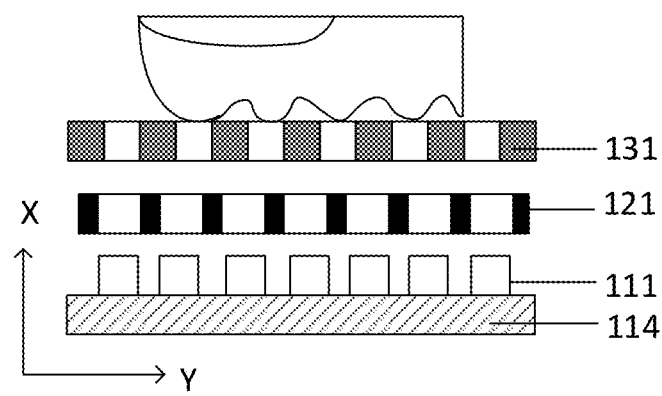
FIG. 2A is a structural schematic diagram of a texture recognition device provided by embodiments of the present disclosure.
Figure 2B:
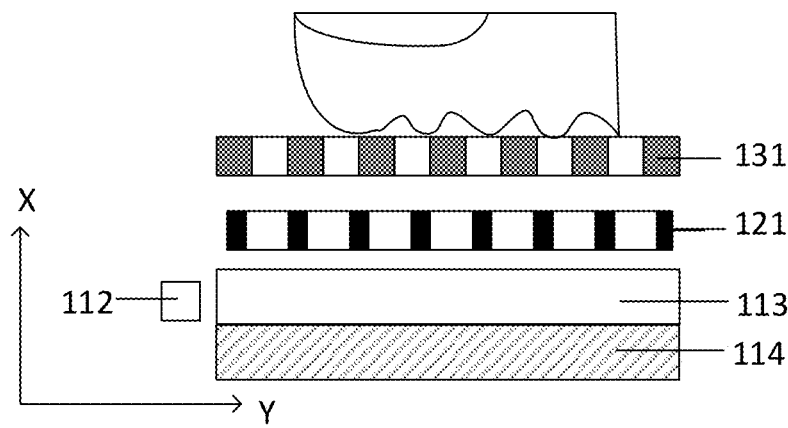
FIG. 2B is another structural schematic diagram of a texture recognition device provided by embodiments of the present disclosure.

FIG. 2A is a structural schematic diagram of a texture recognition device provided by an embodiment of the present disclosure. FIG. 2B is another structural schematic diagram of a texture recognition device provided by an embodiment of the present disclosure.

For example, in some embodiments, as shown in FIG. 2A, the backlight element 110 includes a direct-lit backlight light source 111, the light constraint element 120 includes a collimating film 121, and the photosensitive element 130 includes a plurality of photosensitive sensors, and the plurality of photosensitive sensors are arranged in a plurality of rows and columns to form a photosensitive sensor array 131.

The direct-lit backlight light source 111 is configured to generate initial backlight, and the first backlight includes the initial backlight, that is, the initial backlight may be a part of the first backlight.

The collimating film 121 is located on a side of the direct-lit backlight light source 111 close to the photosensitive sensor array 131, and is configured to transmit part first backlight, whose divergence angle is within the preset angle range, of the first backlight to obtain the second backlight. For example, the collimating film 121 may be configured to transmit part initial backlight, whose divergence angle is within the preset angle range, of the initial backlight to obtain a part of the second backlight.

The photosensitive sensor array 131 is located on a side of the collimating film 121 away from the direct-lit backlight light source 111, and is configured to detect the second backlight reflected by the user's skin to recognize the texture image of the user's skin.

For example, in the case where the texture recognition is performed, the user's skin is located on a side of the photosensitive sensor array 131 away from the collimating film 121.

As shown in FIG. 2A, in some examples, the backlight element 110 may further include a reflecting sheet 114, and the reflecting sheet 14 is located on a side of the direct-lit backlight light source 111 away from the collimating film 121, that is, the direct-lit backlight light source 111 is located between the reflecting sheet 114 and the collimating film 121. For example, a light reflecting surface of the reflecting sheet 114 may face the direct-lit backlight light source 111, and the reflecting sheet 114 is configured to reflect light incident on the reflecting sheet 114 to obtain reflected light, and the reflected light may be transmitted to the collimating film 121. The first backlight also includes the reflected light reflected by the reflecting sheet 114, that is, the reflected light may be a part of the first backlight. The collimating film 121 is also configured to transmit part reflected light, whose divergence angle is within the preset angle range, of the reflected light transmitted to the collimating film 121 to obtain a part of the second backlight.

It should be noted that the "light incident on the reflecting sheet 114" may include a part of the initial backlight emitted by the direct-lit backlight light source 111.

As shown in FIG. 2A, in the direction perpendicular to the light reflecting surface of the reflecting sheet 114, that is, in a first direction X, the reflecting sheet 114, the direct-lit backlight light source 111, the collimating film 121, and the photosensitive sensor array 131 are sequentially stacked.

As shown in FIG. 2A, the texture recognition device provided by the embodiment of the present disclosure can use the collimating film 121 to perform angle constraint process on the first backlight provided by the direct-lit backlight light source 111, so as to obtain the second backlight with the divergence angle within the preset angle range. The small-angle second backlight incident on the user's skin can reduce the crosstalk among the light rays reflected by the user's skin, thus improving the accuracy of texture recognition.

It should be noted that, in the example shown in FIG. 2A, a reflective layer may be provided on a side surface of the collimating film 121 facing the direct-lit backlight light source 111, and the reflective layer may reflect part initial backlight, whose divergence angle is outside the preset angle range, of the initial backlight onto the reflecting sheet 114, and then the part initial backlight is reflected back to the collimating film 121 via the reflecting sheet 114, so as to improve the light efficiency utilization ratio of the direct-lit backlight light source 111. For example, the reflective layer can be made of a material with high reflectivity, and the reflective layer can be made of silver, aluminum, or other materials, and is directly formed on the side surface of the collimating film 121 facing the direct-lit backlight light source 111 by, for example, a coating method. In this case, "light incident on the reflecting sheet 114" may also include light reflected on the reflecting sheet 114 by the reflective layer of the collimating film 121.

For example, in other embodiments, as shown in FIG. 2B, the backlight element 110 includes an edge-lit backlight light source 112 and a light guide plate 113, the light constraint element 120 includes the collimating film 121, and the photosensitive element 130 includes a plurality of photosensitive sensors arranged in an array, and the plurality of photosensitive sensors constitute a photosensitive sensor array 131.

The edge-lit backlight light source 112 is configured to generate light source backlight, and an emitting direction of the light source backlight is a second direction Y, for example, the second direction Y and the first direction X are perpendicular to each other.

The light guide plate 113 is located on a light exit side of the edge-lit backlight light source 112, that is, the edge-lit backlight light source 112 is on a side where the light incident surface of the light guide plate 113 is located. For example, as shown in FIG. 2B, the light guide plate 113 and the edge-lit backlight light source 112 are arranged along the second direction Y. The light guide plate 113 is configured to guide a divergence direction of the light source backlight to obtain initial backlight, and the first backlight includes the initial backlight, that is, the initial backlight may be a part of the first backlight. For example, the divergence direction of the initial backlight is the first direction X.

For example, the light guide plate 113 may be a flat light guide plate or a wedge-shaped light guide plate.

The collimating film 121 is located on a side of the light guide plate 113 close to the photosensitive sensor array 131, and is configured to transmit the part of the first backlight whose divergence angle is within the preset angle range to obtain the second backlight. For example, the collimating film 121 may be configured to transmit part initial backlight, whose divergence angle is within the preset angle range, of the initial backlight to obtain a part of the second backlight.

The photosensitive sensor array 131 is located on a side of the collimating film 121 away from the light guide plate 113, and is configured to detect the second backlight reflected by the user's skin to recognize the texture image of the user's skin.

For example, in the case where texture recognition is performed, the user's skin is located on a side of the photosensitive sensor array 131 away from the collimating film 121.

As shown in FIG. 2B, in some examples, the backlight element 110 may further include a reflecting sheet 114, and the reflecting sheet 114 is located on the side of the light guide plate 113 away from the collimating film 121, that is, the light guide plate 113 is located between the reflecting sheet 114 and the collimating film 121. For example, the light reflecting surface of the reflecting sheet 114 may face the light guide plate 113, and the reflecting sheet 114 is configured to reflect light incident on the reflecting sheet 114 to obtain reflected light, the reflected light may propagate to the collimating film 114 through the light guide plate 113. The first backlight also includes the reflected light after passing through the light guide plate 113, that is, the reflected light may be a part of the first backlight. That is, the collimating film 121 is also configured to transmit part reflected light, whose divergence angle is within the preset angle range, of the reflected light transmitted to the collimating film 121 to obtain a part of the second backlight.

It should be noted that "light incident on the reflecting sheet 114" may include a part of the light source backlight emitted by the side-incident backlight light source 112 and a part of the light source backlight transmitted from the light guide plate 113 to the reflecting sheet 114.

As shown in FIG. 2B, the reflecting sheet 114, the light guide plate 113, the collimating film 121 and the photosensitive sensor array 131 are sequentially stacked in a direction perpendicular to the light reflecting surface of the reflecting sheet 114, that is, in the first direction X.

It should be noted that the edge-lit backlight light source 112 in the embodiment of the present disclosure may include, for example, a line light source or a point light source, the line light source may be a cold cathode fluorescent lamp (CCFL), the point light source may be a light-emitting diode (LED), and a plurality of point light sources may be disposed on a long printed circuit board to obtain a line light source as a whole. The embodiments of the present disclosure are not limited to this case.

It should be noted that the direct-lit backlight light source 111 in the embodiment of the present disclosure may also include a cold cathode fluorescent lamp (CCFL) or a light-emitting diode (LED), etc. The LED may be of various types, such as micro LED (for example, the size of a single device is below 100 μm, for example, below 50 μm) or a plurality of sub-millimeter light-emitting diodes (Mini-LEDs, compared with micro LEDs, the size of a single mini LED is more than 100 μm). The embodiments of the present disclosure are not limited thereto.

As shown in FIG. 2B, the texture recognition device provided by the embodiment of the present disclosure first uses the light guide plate 113 to guide the light source backlight, which is generated by the edge-lit backlight light source 112 and diverges in the second direction Y (e.g., horizontal direction), to be the initial backlight diverging in the first direction X (e.g., vertical direction), the first backlight comprising the initial backlight, and then uses the collimating film 121 to perform angle constraint on the first backlight, so as to obtain the second backlight whose divergence angle is within the preset angle range. The small-angle second backlight is incident on the user's skin, which can reduce the crosstalk among the light rays reflected by the user's skin, thus improving the accuracy of texture recognition.

It should be noted that, in the example shown in FIG. 2B, a reflective layer may be provided on the side surface of the collimating film 121 facing the light guide plate 113, the reflective layer may reflect part initial backlight, whose divergence angle is outside the preset angle range, of the initial backlight onto, for example, the reflecting sheet 114, and then the part initial backlight is reflected back to the collimating film 121 via the reflecting sheet 114, so as to improve the light efficiency utilization rate of the edge-lit backlight light source 112. For example, the reflective layer may be directly formed on the side surface of the collimating film 121 facing the light guide plate 113 by a coating method. In this case, "light incident on the reflecting sheet 114" may also include light reflected on the reflecting sheet 114 by the reflective layer of the collimating film 121.

Figure 3A:
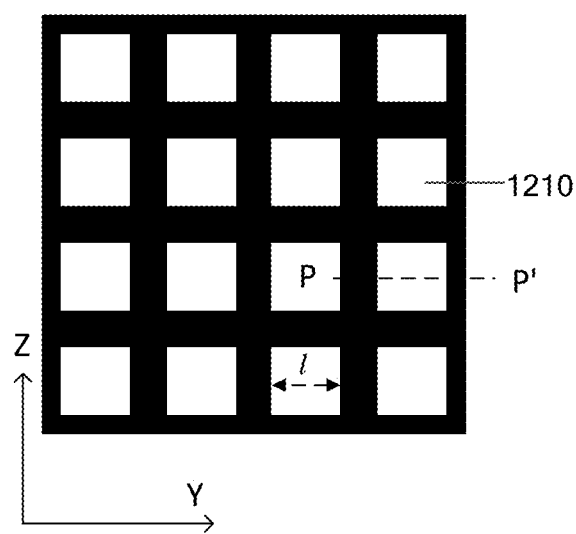
FIG. 3A is a structural schematic diagram of a collimating film in the texture recognition device in FIG. 2A or FIG. 2B.
Figure 3B:
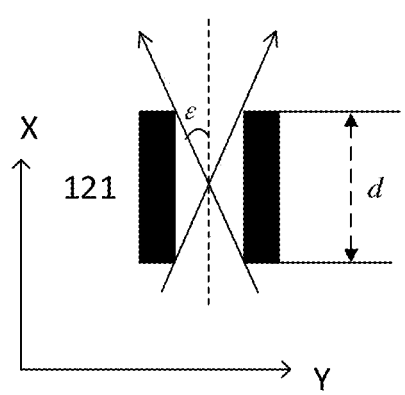
FIG. 3B is a schematic cross-sectional view along a line P-P' in FIG. 3A.

FIG. 3A is an exemplary structure diagram of a collimating film in the texture recognition device shown in FIG. 2A or FIG. 2B. FIG. 3B is a schematic cross-sectional view along a line P-P' in FIG. 3A.

As shown in FIG. 3A, the collimating film 121 has a mesh structure and includes a plurality of hollowed-out regions 1210, and each hollowed-out region 1210 is configured to transmit part first backlight, whose divergence angle is within the preset angle range, of the first backlight to obtain the second backlight.

For example, the plurality of hollowed-out regions 1210 are arranged in an array along the second direction Y and a third direction Z. The third direction Z and the second direction Y are perpendicular to each other.

For example, the plurality of hollowed-out regions 1210 in the collimating film 121 can be uniformly distributed on the collimating film 121, so that the second backlight emitted from the collimating film 121 is uniformly distributed. However, the present disclosure is not limited to this case, and the plurality of hollowed-out regions 1210 in the collimating film 121 may also be unevenly distributed. For example, for the example, shown in FIG. 2B, in the second direction Y, a density of the hollowed-out regions 1210 on a side of the collimating film 121 close to the edge-lit backlight light source 112 may be less than a density of the hollowed-out regions 1210 on a side of the collimating film 121 away from the edge-lit backlight light source 112.

For example, the plurality of hollowed-out regions 1210 may have the same shape, size, and the like, that is, the plurality of hollowed-out regions 1210 are the same. For example, the shape of each hollowed-out region 1210 includes a rectangle (e.g., rectangle, square, etc.), a regular triangle, a regular hexagon, or a circle, etc. However, the present disclosure is not limited to this case, in some examples, at least some hollowed-out regions of the plurality of hollowed-out regions 1210 may be different, for example, the shapes or sizes of at least some hollowed-out regions are different.

For example, the size of each hollowed-out region 1210 ranges from 25 µm to 65 µm, for example, 47 µm. For example, as shown in FIG. 3A, the shape of each hollowed-out region 1210 may be a square, and a side length l of the square in the second direction Y ranges from 25 µm to 65 µm, for example, l is 47 µm. For another example, in other examples, the shape of each hollowed-out region 1210 may be a rectangle, in this case, a long side of the rectangle ranges from 25 µm to 65 µm, a short side of the rectangle ranges from 25 µm to 65 µm, and a length of the long side of the rectangle is greater than a length of the short side of the rectangle, for example, the long side of the rectangle may be 47 µm. For another example, in other examples, the shape of each hollowed-out region 1210 may be a circle, in this case, a diameter of the circle ranges from 25 µm to 65 µm, for example, the diameter of the circle may be 47 µm. For another example, in other examples, the shape of each hollowed-out region 1210 may be a regular triangle, and in this case, a side length of the regular triangle may range from 25 µm to 65 µm, for example, a side length of the regular triangle may be 47 µm. For another example, in other examples, the shape of each hollowed-out region 1210 may be a regular hexagon, and in this case, a distance between two parallel sides of the regular hexagon ranges from 25 µm to 65 µm, for example, may be 47 µm.

As shown in FIG. 3B, in the first direction X, a thickness d of the collimating film 121 ranges from 400 µm to 800 µm, for example, is 600 µm. The divergence angle ε of the second backlight obtained after the first backlight passes through the collimating film 121 is within the preset angle range, and the preset angle range is 0~20 degrees. The divergence angle ε of the second backlight passing through the hollowed-out region 1210 can be controlled by controlling the size of the hollowed-out region 1210 of the collimating film 121 and the thickness of the collimating film 121. For example, in the case where the size of the hollowed-out region 1210 is larger and the thickness of the collimating film 121 is smaller, the divergence angle of the second backlight passing through the hollowed-out region 1210 is larger. It should be noted that the size of the hollowed-out region 1210 and the thickness of the collimating film 121 can be set according to actual conditions.

It should be noted that in the collimating film 121, in the case where the light (e.g., first backlight, second backlight, etc.) used for texture recognition is visible light, the hollowed-out regions 1210 represent regions that the visible light can be transmitted, while the part between adjacent hollowed-out regions 1210 (black part in FIG. 3A) represents a region that the visible light can not be transmitted; and in the case where the light (e.g., first backlight, second backlight, etc.) used for texture recognition is infrared light, etc., the hollowed-out regions 1210 represent regions that the infrared light can be transmitted, while the part between adjacent hollowed-out regions 1210 (black part in FIG. 3A) represents a region that the infrared light can not be transmitted. For example, the reflective layer on the collimating film 121 may be disposed on the black part shown in FIG. 3A.

For example, in the example shown in FIG. 2A, the direct-lit backlight light source 111 may include a plurality of light-emitting diodes, the plurality of light-emitting diodes are also arranged in an array along the second direction Y and the third direction Z, and are configured to provide the initial backlight. For example, the plurality of light-emitting diodes are in one-to-one correspondence to the plurality of hollowed-out regions 1210 of the collimating film 121, and each light-emitting diode at least partially overlaps with the corresponding hollowed-out region 1210 in the direction perpendicular to the collimating film 121, that is, in the first direction X. For example, the orthographic projection of each light-emitting diode on the collimating film 121 is located in the corresponding hollowed-out region 1210. However, the present disclosure is not limited thereto, and in other examples, each light-emitting diode may correspond to a plurality of hollowed-out regions.

Figure 4:
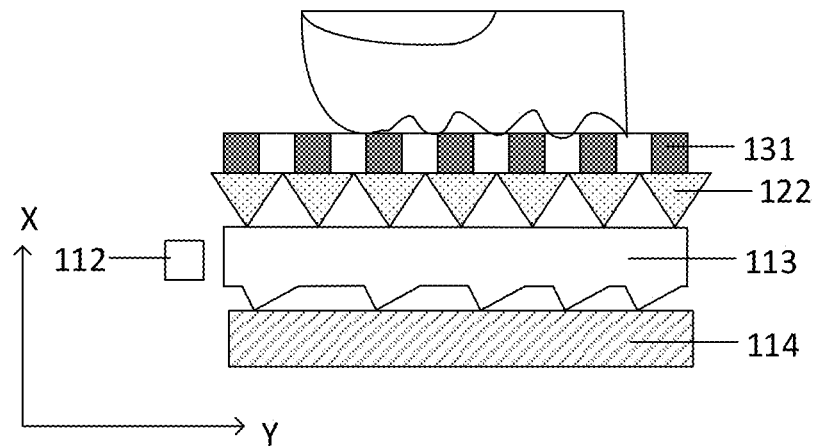
FIG. 4 is yet another structural schematic diagram of a texture recognition device provided by embodiments of the present disclosure.

FIG. 4 is another structural schematic diagram of a texture recognition device provided by an embodiment of the present disclosure.

As shown in FIG. 4, the backlight element 110 includes the edge-lit backlight light source 112 and the light guide plate 113, the light constraint element 120 includes an inverse prism sheet 122, and the photosensitive element 130 includes the plurality of photosensitive sensors.

The edge-lit backlight light source 112 is configured to generate light source backlight, and the emitting direction of the light source backlight is the second direction Y.

The light guide plate 113 is located on the light exit side of the edge-lit backlight light source 112, that is, the edge-lit backlight light source 112 is located on the side where the light incident surface of the light guide plate 113 is located. For example, as shown in FIG. 4, the light guide plate 113 and the edge-lit backlight light source 112 are arranged along the second direction Y. The light guide plate 113 is configured to guide the divergence direction of the light source backlight to obtain initial backlight, and the first backlight includes the initial backlight, that is, the initial backlight may be a part of the first backlight. For example, the divergence direction of the initial backlight is the first direction X.

The inverse prism sheet 122 is located on a side of the light guide plate 113 close to the photosensitive sensor array 131, for example, the inverse prism sheet 122 is on the light exit side of the light guide plate 113. The inverse prism sheet 122 is configured to refract the first backlight to obtain the second backlight.

The photosensitive sensor array 131 is located on a side of the inverse prism sheet 122 away from the light guide plate 113, that is, the inverse prism sheet 122 is located between the light guide plate 113 and the photosensitive sensor array 131. The plurality of photosensitive sensors in the photosensitive sensor array 131 are configured to detect the second backlight reflected by the user's skin to recognize the texture image of the user's skin.

For example, in the case where texture recognition is performed, the user's skin is located on the side of the photosensitive sensor array 131 away from the inverse prism sheet 122.

In some examples, as shown in FIG. 4, the backlight element 110 may further include a reflecting sheet 114, and the reflecting sheet 114 is located on the side of the light guide plate 113 away from the inverse prism sheet 122, that is, the light guide plate 113 is located between the reflecting sheet 114 and the inverse prism sheet 122. For example, the light reflecting surface of the reflecting sheet 114 may face the light guide plate 113, and the reflecting sheet 114 is configured to reflect light incident on the reflecting sheet 114 to obtain reflected light, the reflected light may propagate to the inverse prism sheet 122 through the light guide plate 113. The first backlight also includes reflected light after passing through the light guide plate 113, that is, the reflected light may be a part of the first backlight. That is, the inverse prism sheet 122 is also configured to refract the reflected light propagating to the inverse prism sheet 122 to obtain a part of the second backlight.

It should be noted that "light incident on the reflecting sheet 114" may include a part of the light source backlight emitted by the side-incident backlight light source 112 and a part of the light source backlight transmitted from the light guide plate 113 to the reflecting sheet 114.

As shown in FIG. 4, the reflecting sheet 114, the light guide plate 113, the inverse prism sheet 122, and the photosensitive sensor array 131 are sequentially stacked in a direction perpendicular to the light reflecting surface of the reflecting sheet 114, that is, in the first direction X.

As shown in FIG. 4, the texture recognition device provided by the embodiment of the present disclosure can first uses the light guide plate 113 to guide the light source backlight, which is generated by the edge-lit backlight light source 112 and diverges in the second direction Y (e.g., horizontal direction), to be the initial backlight diverging in the first direction X (e.g., vertical direction), the first backlight comprising the initial backlight, and then uses the inverse prism sheet 122 to perform angle constraint on the first backlight, so as to obtain the second backlight whose divergence angle is within the preset angle range. The small-angle second backlight is incident on the user's skin, which can reduce the crosstalk among the light rays reflected by the user's skin, thus improving the accuracy of texture recognition.

Figure 5:
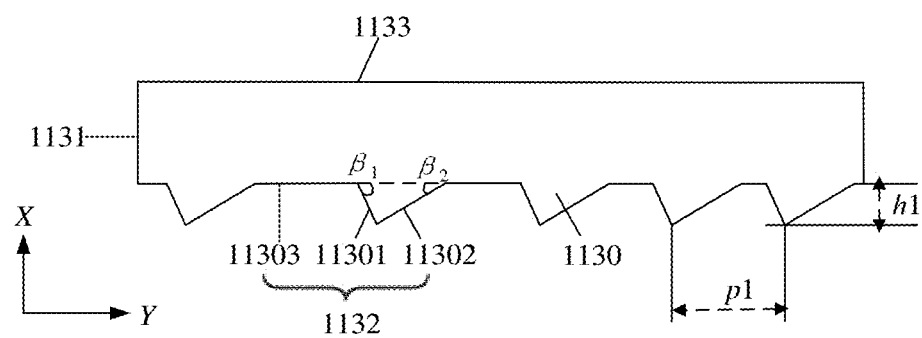
FIG. 5 is a structural schematic diagram of a light guide plate in the texture recognition device shown in FIG. 4.

FIG. 5 is a schematic structural diagram of a light guide plate in the texture recognition device shown in FIG. 4.

As shown in FIG. 5, the light guide plate 113 includes a first light incident surface 1131, a first light reflecting surface 1132, and a first light exit surface 1133. The first light reflecting surface 1132 and the first light exit surface 1133 are oppositely arranged in the first direction X, and the first light incident surface 1131 is in contact with the first light reflecting surface 1132 and the first light exit surface 1133, respectively. The first light incident surface 1131 causes the light source backlight from the side-incident backlight light source 112 to be incident onto the light guide plate 113. The first light reflecting surface 1132 reflects the light source backlight incident on the first light reflecting surface 1132 to obtain initial backlight. The first light exit surface 1133 allows the initial backlight to be emitted from the light guide plate 113. Here, the first backlight includes the initial backlight, that is, the initial backlight may be a part of the first backlight.

As shown in FIG. 5, the first light reflecting surface 1132 includes a prism pillar structure array, and the prism pillar structure array includes a plurality of triangular prism pillars 1130 arranged in sequence in the second direction Y. The first light reflecting surface 1132 includes a first side surface 11301 of the triangular prism pillar 1130, a second side surface 11301 of the triangular prism pillar 1130, and a spacing surface 11303 between two adjacent triangular prism pillars 1130. It should be noted that in other embodiments of the present disclosure, the prism pillar structure array may also include a plurality of quadrangular prism pillars, pentagonal prism pillars, or other prism pillars arranged in sequence in the second direction Y, which is not limited by the embodiments of the present disclosure.

It should be noted that the first light reflecting surface 1132 can reflect the light incident on the first light reflecting surface 1132 to the first light exit surface 1133. In this case, the backlight element may not be provided with a reflecting sheet. However, the present disclosure is not limited to this case, in some examples, the first light reflecting surface 1132 may not have a reflecting function. In this case, the backlight element may include a reflecting sheet, and the reflecting sheet is located on a side of the first light reflecting surface 1132 away from the first light exit surface 1133, and the reflecting surface of the reflecting sheet faces the first light reflecting surface 1132, and the light incident on the first light reflecting surface 1132 can pass through the first light reflecting surface 1132, can be incident on the reflecting sheet, and then can be reflected back to the light guide plate 113 by the reflecting sheet.

As shown in FIG. 5, the first direction X and the second direction Y are perpendicular to each other, and in the first direction X, the thickness h1 of each triangular prism pillar is greater than 0 μm and less than 2.5 μm; and in the second direction Y, the distance p1 between two adjacent triangular prism pillars ranges from 45 μm to 50 μm. A first base angle $\beta_1$ of each triangular prism pillar ranges from 80 degrees to 90 degrees, and a second base angle $\beta_2$ of each triangular prism pillar ranges from 1 degree to 2.5 degrees.

In embodiments of the present disclosure, the material of the light guide plate 113 may include plastic materials or other materials that are easy to be processed and molded. For example, the material of the light guide plate 113 may be at least one selected from a group consisting of PMMA (poly methyl meth-acrylate), PC (Polycarbonate), PI (Polyimide), PES (Polyethersulfone resin), and PET (Polyethylene terephthalate), and the embodiments of the present disclosure are not limited thereto.

It should be noted that the light guide plate 113 shown in FIG. 5 can also be applied to the embodiment shown in FIG. 2B.

Figure 6:
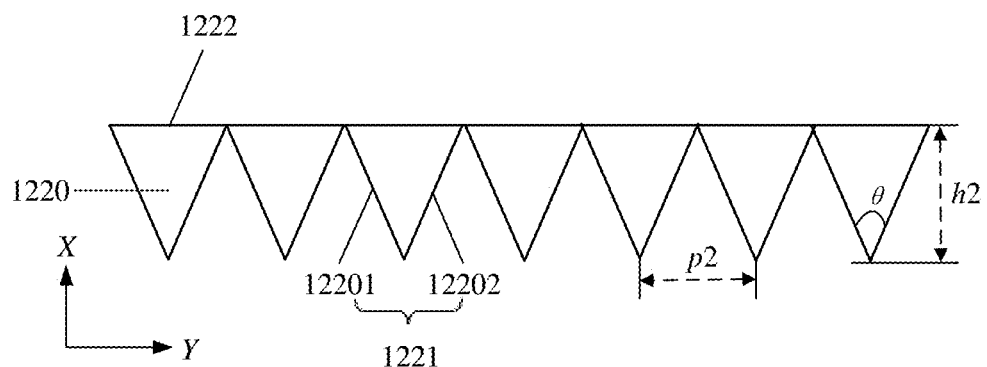
FIG. 6 is a structural schematic diagram of an inverse prism sheet in the texture recognition device shown in FIG. 4.

FIG. 6 is a structural schematic diagram of an inverse prism sheet in the texture recognition device shown in FIG. 4.

As shown in FIG. 6, the inverse prism sheet 122 includes a second light incident surface 1221 and a second light exit surface 1222, the second light incident surface 1221 and the second light exit surface 1222 are oppositely arranged in the first direction X. The second light incident surface 1221 is configured to receive the first backlight, that is, the first backlight is incident on the second light incident surface 1221 and the second backlight is emitted from the second light exit surface 1222.

As shown in FIG. 6, the second light incident surface 1221 includes an inverse prism structure array, and the inverse prism structure array includes a plurality of inverse prisms 1220 arranged in sequence in the second direction Y.

The second light incident surface 1221 includes a first side surface 12201 of the inverse prism 1220 and a second side surface 12202 of the inverse prism 1220.

As shown in FIG. 5, the first direction X and the second direction Y are perpendicular to each other, and in the first direction X, the thickness h2 of each inverse prism ranges from 10 μm to 25 μm: and in the second direction Y, the distance p2 between vertex angles of two adjacent inverse prisms ranges from 20 μm to 50 μm. The apex angle of each inverse prism θ ranges from 60 degrees to 75 degrees.

For example, the inverse prism sheet may be a film with a prism structure formed by covering the surface of PET (Polyethylene terephthalate) matrix material with UV (Ultra-Violet) curable resin material.

For example, each inverse prism may be a triangular prism pillar. In other embodiments of the present disclosure, the shape of the inverse prism may also be a quadrangular prism pillar, a pentagonal prism pillar, or other prism pillar, and the embodiments of the present disclosure are not limited thereto.

It should be noted that in the example shown in FIG. 6, two adjacent inverse prisms in the inverse prism structure array are in direct contact with each other, but the present disclosure is not limited to this case. In other examples, two adjacent inverse prisms in the inverse prism structure array may not be in direct contact, that is, there is a certain interval distance between two adjacent inverse prisms. In this case, the second light incident surface 1221 also includes a spacing surface between two adjacent inverse prisms 1220.

Figure 7:
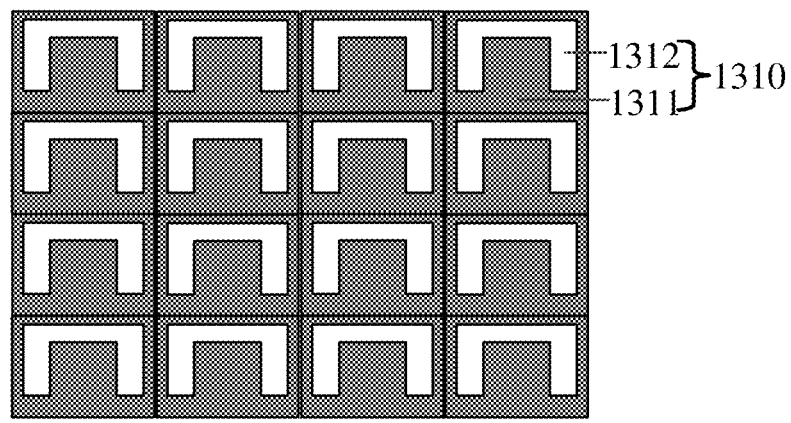
FIG. 7 is a structural schematic diagram of a photosensitive element in the texture recognition device shown in FIGS. 2A, 2B and 4.

FIG. 7 is a structural schematic diagram of a photosensitive element in the texture recognition device shown in FIGS. 2A, 2B, and 4.

As shown in FIG. 7, the photosensitive element 130 includes a plurality of photosensitive sensors 1310, and the plurality of photosensitive sensors 1310 may be arranged in an array along the second direction Y and the third direction Z.

For example, each photosensitive sensor 1310 may be a light transmitting sensor, and each photosensitive sensor 1310 includes a light transmitting region 1311 and a photoelectric conversion region 1312. The light transmitting region 1311 at least partially surrounds the photoelectric conversion region 1312. Two adjacent photosensitive sensors 1310 are in direct contact.

For example, the light transmission region 1311 is used to transmit the second backlight emitted from the light constraint element 120, so that the second backlight can be incident on the user's skin.

For example, respective photosensitive sensors 1310 are in one-to-one correspondence to the plurality of hollowed-out regions 1210 of the collimating film 121, and in the direction perpendicular to the collimating film 121, that is, in the first direction X, the light transmitting region 1131 of each photosensitive sensor 1310 at least partially overlaps with the corresponding hollowed-out region 1210 of the collimating film 121, so that the second backlight transmitted from the hollowed-out region 1210 of the collimating film 121 can be incident on the user's skin through the light transmitting region 1131 of the photosensitive sensor 1310. However, the present disclosure is not limited to this case, and in other examples, each photosensitive sensor 1310 may correspond to a plurality of hollowed-out regions.

For example, the photoelectric conversion region 1312 may be provided with a plurality of photosensitive units, the photosensitive units may be photodiodes (PD), phototransistors, etc., and the photosensitive units are used to convert the second backlight reflected through the user's skin into current signals. For finger fingerprints, because the ridge lines and valley lines of finger fingerprints have different geometric characteristics, and the ridge lines are convex and the valley lines are concave, in a case where the ridge lines and the valley lines are illuminated by light (e.g., the second backlight), the reflection intensity of the ridge lines to light is different from the reflection intensity of the valley lines to light, resulting in that current signals obtained by respective photosensitive sensors 1310 in the photosensitive element 130 are also different. By detecting the magnitudes of the current signals, fingerprint recognition can be achieved.

For example, as shown in FIG. 7, an exemplary shape of the light transmitting region 1311 may be a concave shape so as to partially surround the photoelectric conversion region 1312. Or, the light transmitting region 1311 may have other shapes, such as I-shape or the like.

It should be noted that the embodiments of this present disclosure are not limited to this case. In other examples, each photosensitive sensor may only include a photoelectric conversion region, and the plurality of photosensitive sensors are arranged at intervals, that is, there is a certain interval between adjacent photosensitive sensors, and the interval region between adjacent photosensitive sensors can be used to transmit the second backlight emitted from the light constraint element 120, so that the second backlight can be incident on the user's skin.

Figure 8A:
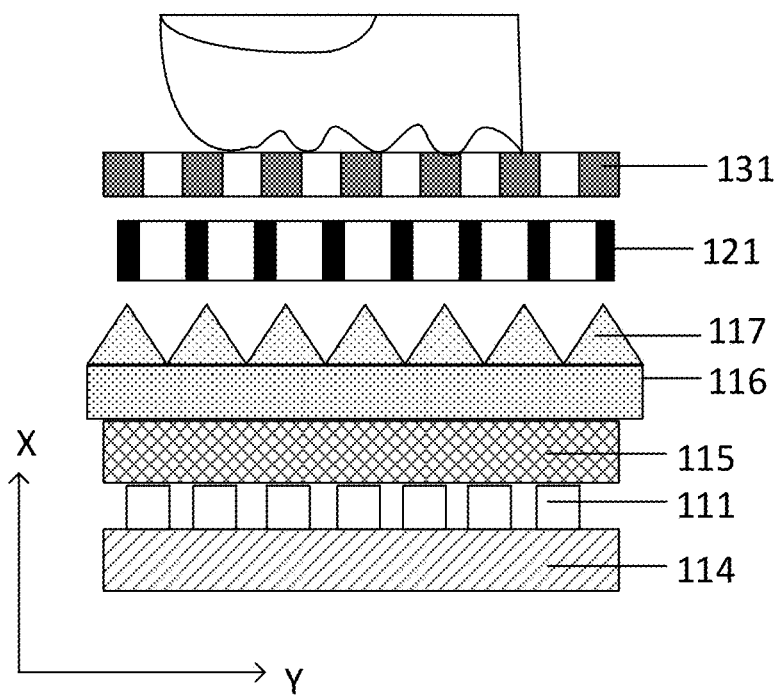
FIG. 8A is another structural schematic diagram of a texture recognition device provided by embodiments of the present disclosure.
Figure 8B:
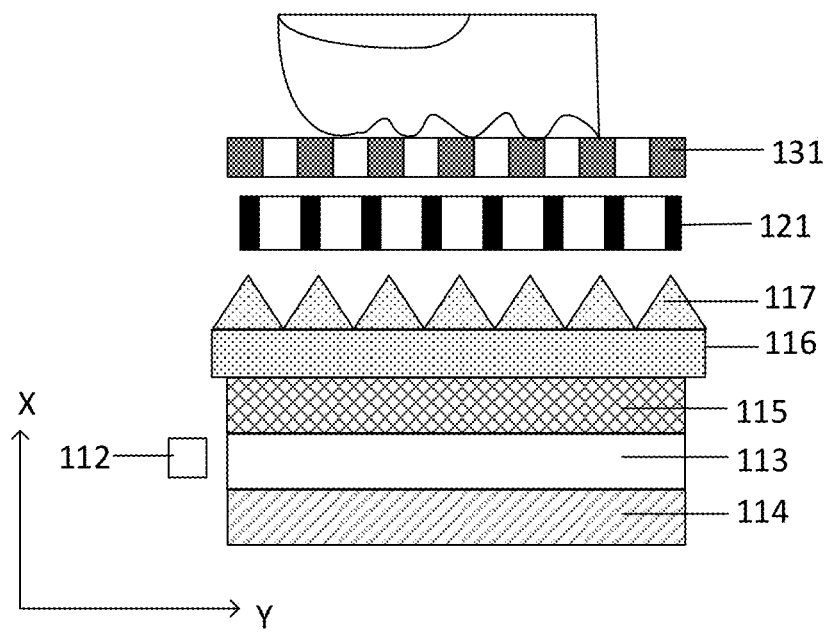
FIG. 8B is another structural schematic diagram of a texture recognition device provided by embodiments of the present disclosure.

FIG. 8A is another structural schematic diagram of a texture recognition device provided by an embodiment of the present disclosure. FIG. 8B is another structural schematic diagram of a texture recognition device provided by an embodiment of the present disclosure.

As shown in FIG. 8A, the backlight element 110 may include a first backlight module, the first backlight module may include a direct-lit backlight light source 111, a diffusion sheet 115, a first prism sheet 116, and a second prism sheet 117. The light constraint element 120 includes a collimating film 121; the photosensitive element 130 includes a plurality of photosensitive sensors, and the plurality of photosensitive sensors are arranged in a plurality of rows and columns to constitute a photosensitive sensor array 131.

The direct-lit backlight light source 111 is configured to generate initial backlight.

The diffusion sheet 115 is located on a side of the direct-lit backlight light source 111 close to the collimating film 121, and is configured to sufficiently scatter the initial backlight from the direct-lit backlight light source 111.

The first prism sheet 116 is located on a side of the diffusion sheet 115 close to the collimating film 121, that is, the first prism sheet 116 is located between the diffusion sheet 115 and the collimating film 121. The second prism sheet 117 is located on a side of the first prism sheet 116 close to the collimating film 121, that is, the second prism sheet 117 is located between the first prism sheet 116 and the collimating film 121. The first prism sheet 116 and the second prism sheet 117 are configured to gather the initial backlight emitted from the diffusion sheet 115 to obtain intermediate backlight, and the divergence angle of the initial backlight is greater than the divergence angle of the intermediate backlight. The first backlight includes the intermediate backlight, that is, the intermediate backlight may be a part of the first backlight.

The collimating film 121 is located on a side of the second prism sheet 117 close to the photosensitive sensor array 131, and is configured to transmit part first backlight, whose divergence angle is within the preset angle range, of the first backlight to obtain the second backlight. For example, the collimating film 121 may be configured to transmit part intermediate backlight, whose divergence angle is within the preset angle range, of the intermediate backlight to obtain a part of the second backlight.

The photosensitive sensor array 131 is located on the side of the collimating film 121 away from the second prism sheet 117, and is configured to detect the second backlight reflected by the user's skin to recognize the texture image of the user's skin.

For example, in the case where texture recognition is performed, the user's skin is located on the side of the photosensitive sensor array 131 away from the collimating film 121.

As shown in FIG. 8A, in some examples, the first backlight module may further include a reflecting sheet 114, and the reflecting sheet 114 is located on a side of the direct-lit backlight light source 111 away from the diffusion sheet 115, that is, the direct-lit backlight light source 111 is located between the reflecting sheet 114 and the diffusion sheet 115. For example, a light reflecting surface of the reflecting sheet 114 may face the direct-lit backlight light source 111, and the reflecting sheet 114 is configured to reflect the light incident on the reflecting sheet 114 to obtain reflected light, the reflected light may propagate to the collimating film through the diffusion sheet 115, the first prism sheet 116, and the second prism sheet 117 in sequence. The first backlight also includes the reflected light after passing through the diffusion sheet 115, the first prism sheet 116, and the second prism sheet 117, that is, the reflected light is a part of the first backlight. That is, the collimating film 121 is also configured to transmit part reflected light, whose divergence angle is within the preset angle range, of the reflected light transmitted to the collimating film 121 to obtain a part of the second backlight.

It should be noted that the "light incident on the reflecting sheet 114" may include a part of the initial backlight emitted by the direct-lit backlight light source 111 and a part of the initial backlight scattered by the diffusion sheet 115 to the reflecting sheet 114.

As shown in FIG. 8A, in the direction perpendicular to the light reflecting surface of the reflecting sheet 114, that is, in the first direction X, the reflecting sheet 114, the direct-lit backlight light source 111, the diffusion sheet 115, the first prism sheet 116, the second prism sheet 117, the collimating film 121, and the photosensitive sensor array 131 are sequentially stacked.

As shown in FIG. 8B, the backlight element 110 may include a second backlight module, the second backlight module may include an edge-lit backlight light source 112, a light guide plate 113, a diffusion sheet 115, a first prism sheet 116, and a second prism sheet 117. The light constraint element 120 includes a collimating film 121; and the photosensitive element 130 includes a plurality of photosensitive sensors, and the plurality of photosensitive sensors are arranged in a plurality of rows and columns to constitute a photosensitive sensor array 131.

The edge-lit backlight light source 112 is configured to generate light source backlight, and an emitting direction of the light source backlight is the second direction Y.

The light guide plate 113 is located on a light exit side of the edge-lit backlight light source 112, that is, the edge-lit backlight light source 112 is disposed on a light incident side of the light guide plate 113. For example, as shown in FIG. 8B, the light guide plate 113 and the edge-lit backlight light source 112 are arranged along the second direction Y. The light guide plate 113 is configured to guide the divergence direction of the light source backlight to obtain the initial backlight. For example, the divergence direction of the initial backlight is the first direction X.

The diffusion sheet 115 is located on a side of the light guide plate 113 close to the collimating film 121, that is, the diffusion sheet 115 is located between the light guide plate 113 and the collimating film 121, and is configured to sufficiently scatter the initial backlight emitted from the light guide plate 113.

The first prism sheet 116 is located on a side of the diffusion sheet 115 close to the collimating film 121, that is, the first prism sheet 116 is located between the diffusion sheet 115 and the collimating film 121. The second prism sheet 117 is located on a side of the first prism sheet 116 close to the collimating film 121, that is, the second prism sheet 117 is located between the first prism sheet 116 and the collimating film 121. The first prism sheet 116 and the second prism sheet are configured to gather the initial backlight emitted from the diffusion sheet 115 to obtain the intermediate backlight, and the divergence angle of the initial backlight is greater than the divergence angle of the intermediate backlight. The first backlight includes the intermediate backlight, and the intermediate backlight may be a part of the first backlight.

The collimating film 121 is located on a side of the second prism sheet 117 close to the photosensitive sensor array 131, and is configured to transmit part first backlight, whose divergence angle is within the preset angle range, of the first backlight to obtain the second backlight. For example, the collimating film 121 may be configured to transmit part intermediate backlight, whose divergence angle is within the preset angle range, of the intermediate backlight to obtain a part of the second backlight.

The photosensitive sensor array 131 is located on a side of the collimating film 121 away from the second prism sheet 117, and is configured to detect the second backlight reflected by the user's skin to recognize the texture image of the user's skin.

For example, in the case where texture recognition is performed, the user's skin is located on a side of the photosensitive sensor array 131 away from the collimating film 121.

As shown in FIG. 8B, in some examples, the second backlight module may further include a reflecting sheet 114, and the reflecting sheet 114 is located on a side of the light guide plate 113 away from the diffusion sheet 115, that is, the light guide plate 113 is located between the reflecting sheet 114 and the diffusion sheet 115. For example, the light reflecting surface of the reflecting sheet 114 may face the light guide plate 113, and the reflecting sheet 114 is configured to reflect the light incident on the reflecting sheet 114 to obtain the reflected light, and the reflected light can propagate to the collimating film through the light guide plate 113, the diffusion sheet 115, the first prism sheet 116, and the second prism sheet 117. The first backlight also includes the reflected light after passing through the light guide plate 113, the diffusion sheet 115, the first prism sheet 116, and the second prism sheet 117, that is, the reflected light may be a part of the first backlight. That is, the collimating film 121 is also configured to transmit part reflected light, whose divergence angle is within the preset angle range, of the reflected light transmitted to the collimating film 121 to obtain a part of the second backlight.

It should be noted that "light incident on the reflecting sheet 114" may include a part of the light source backlight emitted by the side-incident backlight light source 112 and a part of the light source backlight transmitted from the light guide plate 113 to the reflecting sheet 114.

As shown in FIG. 8B, the reflecting sheet 114, the light guide plate 113, the diffusion sheet 115, the first prism sheet 116, the second prism sheet 117, the collimating film 121, and the photosensitive sensor array 131 are sequentially stacked in the direction perpendicular to the light reflecting surface of the reflecting sheet 114, that is, in the first direction X.

As shown in FIG. 8A and FIG. 8B, the texture recognition device provided by the embodiment of the present disclosure can use the collimating film to perform angle constraint on the first backlight provided by the conventional backlight module (i.e., the first backlight module and the second backlight module), so as to obtain the second backlight with the divergence angle within the preset angle range. The small-angle second backlight is incident on the user's skin, which can reduce the crosstalk between the light rays reflected by the user's skin, thus improving the accuracy of texture recognition.

Figure 8C:
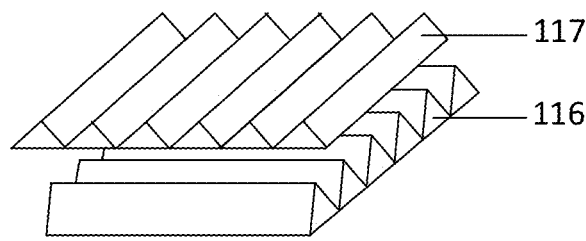
FIG. 8C is a schematic diagram showing a three-dimensional structure of a first prism sheet and a second prism sheet in the texture recognition device in FIGS. 8A and 8B.

FIG. 8C is a schematic diagram showing a three-dimensional structure of a first prism sheet and a second prism sheet in the texture recognition device shown in FIGS. 8A and 8B.

As shown in FIG. 8C, the first prism sheet 116 and the second prism sheet 117 may be disposed crosswise. For example, the structure of the first prism sheet 116 and the structure of the second prism sheet 117 may be the same. Taking the second prism sheet 117 as an example, an angle of a prism vertex angle of the second prism sheet 117 may range from 90 degrees to 110 degrees, and a distance between two adjacent prisms may range from 24 μm to 110 μm. It should be noted that in the embodiment of the present disclosure, the diffuser 115, the first prism sheet 116, the second prism sheet 117, etc. can refer to the design in the conventional backlight module, and repeated portions will not be described in detail here.

In an embodiment of the present disclosure, the material of the diffusion sheet 115 may include plastic materials or other materials which are easy to be processed and formed. For example, the material of the diffusion sheet 115 may be at least one selected from a group consisting of PMMA (poly methyl methacrylate), PC (polycarbonate), PI (polyimide), PES (polyethersulfone resin), and PET (polyethylene terephthalate), and the embodiments of the present disclosure are not limited thereto.

Figure 9A:
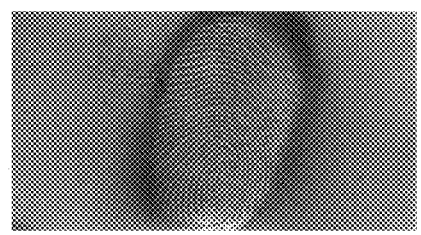
FIG. 9A is a schematic diagram of a fingerprint detected by the texture recognition device shown in FIG. 4.
Figure 9B:
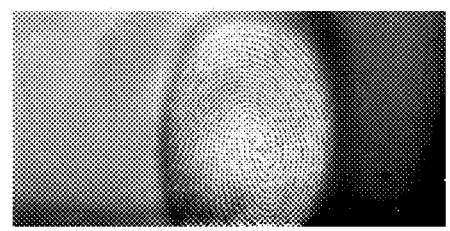
FIG. 9B is a schematic diagram of a fingerprint detected by a texture recognition device having a conventional backlight module.

FIG. 9A is a schematic diagram of a fingerprint detected by the texture recognition device shown in FIG. 4 according to the present disclosure, and FIG. 9B is a schematic diagram of a fingerprint detected by the texture recognition device using a conventional backlight module.

After testing, as shown in FIG. 9A, a contrast ratio of the fingerprint detected by the texture recognition device shown in FIG. 4 according to the present disclosure is 1.29; as shown in FIG. 9B, a contrast ratio of the fingerprint detected by the texture recognition device using a conventional backlight module (hereinafter referred to as "conventional texture recognition device") is 1.17, that is, the texture recognition device provided by the embodiment of the present disclosure can improve the contrast ratio of texture recognition, thereby improving the precision of texture recognition. For example, the formula of the contrast ratio is: the contrast ratio=gray value of the ridge/gray value of the valley. It should be noted that "the gray value of the ridge" can represent an average value of a plurality of gray values of a plurality of ridges, and "the gray value of the valley" can represent an average value of a plurality of gray values of a plurality of valleys.

In order to verify the influence of reducing the angle of incident light on texture recognition, the light tools software can be used for simulation. Tables 1 and 2 show the results of a plurality of fingerprint recognition by simulating 100 million light rays.

Table 1 is a table of fingerprint contrast ratios obtained in the case where fingerprint recognition is performed by using second backlight with different divergence angles.

TABLE 1

| | Divergence angle | | | | | | | |
|---|---|---|---|---|---|---|---|---|
| | 60° | | 30° | | 15° | | 1° | |
| | valley | ridge | valley | ridge | valley | ridge | valley | ridge |
| Gray value | 0.069 | 0.075 | 0.071 | 0.079 | 0.070 | 0.079 | 0.064 | 0.089 |
| Contrast ratio | 1.08 | | 1.11 | | 1.23 | | 1.39 | |

As shown in the data in Table 1, in the case where the divergence angle of the second backlight incident on the fingerprint skin of the user is 60 degrees, the contrast ratio of the detected fingerprint image is 1.08; in the case where the divergence angle of the second backlight incident on the fingerprint skin of the user is 60 degrees, the contrast ratio of the detected fingerprint image is 1.08; in the case where the divergence angle of the second backlight incident on the fingerprint skin of the user is 30 degrees, the contrast ratio of the detected fingerprint image is 1.11; and in the case where the divergence angle of the second backlight incident on the fingerprint skin of the user is 15 degrees, the contrast ratio of the detected fingerprint image is 1.23; and in the case where the divergence angle of the second backlight incident on the fingerprint skin of the user is 1 degree, the contrast ratio of the detected fingerprint image is 1.39.

It can be seen from the data in Table 1 above that the smaller the divergence angle of the second backlight is, the higher the contrast ratio of the fingerprint image is, that is, the divergence angle of the backlight emitted by the light source can be reduced by using the light constraint element, so as to achieve the purpose of improving the contrast.

Table 2 is a table of fingerprint contrast ratios obtained in the case where fingerprint recognition is performed using the texture recognition device of the present disclosure and the conventional texture recognition device.

TABLE 2

| | Ridge (the amount of gray values) | Valley (the amount of gray values) | Contrast ratio | Average contrast ratio |
|---|---|---|---|---|
| Texture recognition device of the present disclosure | 21672 | 19824 | 1.09 | 1.14 |
| | 22985 | 19825 | 1.16 | |
| | 22961 | 19691 | 1.17 | |
| Conventional texture recognition device | 43684 | 39252 | 1.11 | 1.06 |
| | 40393 | 38467 | 1.05 | |
| | 41432 | 40245 | 1.03 | |

For example, the experimental data in Table 2 are obtained by repeating a plurality of tests under the same experimental condition. As shown in the data in Table 2, in the case where the texture recognition device provided by the embodiment of the present disclosure is used to perform texture recognition, the contrast ratio of the detected fingerprint image is high, for example, an average contrast ratio of fingerprints obtained by three experiments is 1.14, and in the case where the conventional texture recognition device is used to perform texture recognition, the contrast ratio of the detected fingerprint image is low, for example, an average contrast ratio of fingerprints obtained by three experiments is 1.06.

It can be seen from the data in Table 2 above that compared with the conventional fingerprint recognition device, the fingerprint recognition device provided by the present disclosure can significantly improve the contrast ratio of the detected fingerprint image. According to the texture recognition device provided by the embodiment of the present disclosure, the light constraint element can be used to perform the angle constraint on the first backlight provided by the backlight element, so that the second backlight with the divergence angle within the preset angle range can be obtained, and the crosstalk between light rays reflected by the user's skin can be reduced in the case where the second backlight having a small angle is incident on the user's skin, so that the precision of the texture recognition can be improved.

The embodiment of the present disclosure also provides a display device, the display device comprises the texture recognition device provided by any one embodiment of the present disclosure. The display device comprises a display region and a peripheral region located outside the display region, and the texture recognition device can be disposed in the peripheral region or in the display region.

For example, the display device may also include a display panel, and the backlight element in the texture recognition device may be further located on a light incident side of the display panel, thereby providing the display panel with, for example, light for display.

For example, the display panel may be a liquid crystal display panel, an electronic paper display panel, or other types of panels with display functions, and the embodiments of the present disclosure are not limited to this case.

The display device in the embodiments of the present disclosure can be any product or component with a display function, such as a liquid crystal panel, a liquid crystal TV, a display, an OLED panel, an OLED TV, an electronic paper, a mobile phone, a tablet computer, a notebook computer, a digital photo frame, a navigator, and the like. The display device may also include other conventional components, such as a display panel, and the embodiments of the present disclosure are not limited thereto.

The display device provided by the embodiments of the present disclosure has the same or similar beneficial effects as the texture recognition device provided by the foregoing embodiments of the present disclosure. For the detailed description and technical effects of the display device provided by the embodiment of the present disclosure, reference may be made to the corresponding description in the embodiments of the texture recognition device, and the repeating portions will not be repeated here.

For the present disclosure, the following points need to be explained:

(1) The drawings of the embodiments of the present disclosure only refer to the structures related to the embodiments of the present disclosure, and other structures may refer to the general design.

(2) In case of no conflict, the embodiments of the present disclosure and the features in the embodiments can be combined with each other to obtain new embodiments.

What have been described above merely are specific implementations of the present disclosure, but the protective scope of the present disclosure is not limited to this case. The protective scope of the present disclosure is determined by the protection scope of the appended claims.

What is claimed is:

1. A texture recognition device, comprising:
    a backlight element, configured to provide first backlight;
    a light constraint element, configured to perform a light divergence angle constraint process on the first backlight to obtain second backlight with a divergence angle within a preset angle range, wherein the second backlight is transmitted to a detection object; and
    a photosensitive element, configured to detect the second backlight reflected by a texture of the detection object to recognize a texture image of the texture of the detection object;
    wherein the light constraint element comprises a collimating film, the collimating film has a mesh structure and comprises a plurality of hollowed-out regions, and each of the plurality of hollowed-out regions is configured to transmit part first backlight, whose divergence angle is within the preset angle range, of the first backlight to obtain the second backlight,
    the backlight element comprises a direct-lit backlight light source, the direct-lit backlight light source comprises a plurality of light-emitting diodes arranged in an array,
    the plurality of light-emitting diodes are in one-to-one correspondence to the plurality of hollowed-out regions, and each of the plurality of light-emitting diodes at least partially overlaps with a corresponding hollowed-out region in a direction perpendicular to the collimating film.

2. The texture recognition device according to claim 1, wherein the plurality of hollowed-out regions are arranged in an array, and a shape of each of the plurality of hollowed-out regions comprises a square, a rectangle, a regular triangle, a regular hexagon, or a circle.

3. The texture recognition device according to claim 2, wherein a thickness of the collimating film ranges from 400 μm to 800 μm.

4. The texture recognition device according to claim 2, wherein a size of each of the plurality of hollowed-out regions ranges from 25 μm to 65 μm,
    in a case where the shape of each of the plurality of hollowed-out regions is a square, a side length of the square ranges from 25 μm to 65 μm;
    in a case where the shape of each of the plurality of hollowed-out regions is a rectangle, a long side of the rectangle ranges from 25 μm to 65 μm, a short side of the rectangle ranges from 25 μm to 65 μm, and a length of the long side is greater than a length of the short side;
    in a case where the shape of each of the plurality of hollowed-out regions is a regular triangle, a side length of the regular triangle ranges from 25 μm to 65 μm;
    in a case where the shape of each of the plurality of hollowed-out regions is a regular hexagon, a distance between two parallel sides of the regular hexagon ranges from 25 μm to 65 μm; and
    in a case where the shape of each of the plurality of hollowed-out regions is a circle, a diameter of the circle ranges from 25 μm to 65 μm.

5. The texture recognition device according to claim 1, wherein the plurality of light-emitting diodes are configured to provide initial backlight, and the first backlight comprises the initial backlight.

6. The texture recognition device according to claim 1, wherein the plurality of light-emitting diodes comprise a plurality of sub-millimeter light-emitting diodes or a plurality of micro light-emitting diodes.

7. The texture recognition device according to claim 1, wherein the backlight element comprises a first backlight module, the first backlight module comprises the direct-lit backlight light source, a diffusion sheet, a first prism sheet, and a second prism sheet, the diffusion sheet is on a side of the direct-lit backlight light source close to the light constraint element, the first prism sheet is on a side of the diffusion sheet close to the light constraint element, and the second prism sheet is on a side of the first prism sheet close to the light constraint element, the direct-lit backlight light source is configured to provide initial backlight, the initial backlight sequentially passes through the diffusion sheet, the first prism sheet, and the second prism sheet to obtain intermediate backlight, and the first backlight comprises the intermediate backlight.

8. The texture recognition device according to claim 1, wherein the backlight element further comprises a reflecting sheet, the reflecting sheet is on a side of the backlight element away from the light constraint element, and is configured to reflect light incident on the reflecting sheet to obtain reflected light, and the first backlight further comprises the reflected light.

9. The texture recognition device according to claim 1, wherein the photosensitive element comprises a plurality of photosensitive sensors arranged in an array, and the plurality of photosensitive sensors are in one-to-one correspondence to the plurality of hollowed-out regions.

10. The texture recognition device according to claim 9, wherein each of the plurality of photosensitive sensors comprises a light transmitting region and a photoelectric conversion region.

11. The texture recognition device according to claim 10, wherein the light transmitting region at least partially surrounds the photoelectric conversion region.

12. The texture recognition device according to claim 1, wherein the preset angle range is 0 degree to 20 degrees.

13. The texture recognition device according to claim 1, wherein the texture of the detection object comprises a skin corresponding to a fingerprint of a user, and the texture image comprises a fingerprint image.

14. A display device, comprising the texture recognition device according to claim 1.

15. A texture recognition device, comprising:
a backlight element, configured to provide first backlight;
a light constraint element, configured to perform a light divergence angle constraint process on the first backlight to obtain second backlight with a divergence angle within a preset angle range, wherein the second backlight is transmitted to a detection object;
a photosensitive element, configured to detect the second backlight reflected by a texture of the detection object to recognize a texture image of the texture of the detection object;
wherein the light constraint element comprises a collimating film, the collimating film has a mesh structure and comprises a plurality of hollowed-out regions, and each of the plurality of hollowed-out regions is configured to transmit part first backlight, whose divergence angle is within the preset angle range, of the first backlight to obtain the second backlight,
wherein the backlight element comprises a second backlight module, the second backlight module comprises an edge-lit backlight light source, a light guide plate, a diffusion sheet, a first prism sheet, and a second prism sheet, the light guide plate is on a light exit side of the edge-lit backlight light source, the diffusion sheet is on a side of the light guide plate close to the light constraint element, the first prism sheet is on a side of the diffusion sheet close to the light constraint element, and the second prism sheet is on a side of the first prism sheet close to the light constraint element, the edge-lit backlight light source is configured to provide light source backlight, the light source backlight sequentially passes through the light guide plate, the diffusion sheet, the first prism sheet, and the second prism sheet to obtain intermediate backlight, and the first backlight comprises the intermediate backlight.

16. A texture recognition device, comprising:
a backlight element, configured to provide first backlight;
a light constraint element, configured to perform a light divergence angle constraint process on the first backlight to obtain second backlight with a divergence angle within a preset angle range, wherein the second backlight is transmitted to a detection object;
a photosensitive element, configured to detect the second backlight reflected by a texture of the detection object to recognize a texture image of the texture of the detection object;
wherein the backlight element comprises an edge-lit backlight light source and a light guide plate, the light guide plate is on a light exit side of the edge-lit backlight light source, the light constraint element comprises an inverse prism sheet, the inverse prism sheet is on a light exit side of the light guide plate, the edge-lit backlight light source is configured to provide light source backlight, and the light source backlight is transmitted through the light guide plate to obtain initial backlight, and the first backlight comprises the initial backlight; and the inverse prism sheet is configured to cause the first backlight to be refracted to obtain the second backlight.

17. The texture recognition device according to claim 16, wherein the light guide plate comprises a first light incident surface, a first light reflecting surface, and a first light exit surface, and the first light reflecting surface and the first light exit surface are oppositely arranged in a first direction, the first light incident surface is configured to receive the light source backlight, the first light reflecting surface is configured to reflect the light source backlight, and the initial backlight emits from the first light exit surface, the first light reflecting surface comprises a prism pillar structure array, the prism pillar structure array comprises a plurality of triangular prism pillars arranged in sequence along a second direction, the second direction is perpendicular to the first direction, a thickness of each of the plurality of triangular prism pillars is less than 2.5 μm in the first direction, a distance between two adjacent triangular prism pillars ranges from 45 μm to 50 μm in the second direction, the inverse prism sheet comprises a second light incident surface and a second light exit surface, the second light incident surface and the second light exit surface are oppositely arranged in the first direction, the second light incident surface is configured to receive the first backlight, the second backlight emits from the second light exit surface, the second light incident surface comprises a prism structure array, the prism structure array comprises a plurality of inverse prisms arranged in sequence along the second direction, in the first direction, a thickness of each of the plurality of inverse prisms ranges from 1 μm to 25 μm, and in the second direction, a distance between two adjacent inverse prisms of the plurality of inverse prisms ranges from 20 μm to 50 μm.

18. The texture recognition device according to claim 16, wherein the photosensitive element comprises a plurality of photosensitive sensors arranged in an array.

\* \* \* \* \*